(12) United States Patent
Hsu et al.

(10) Patent No.: US 7,586,129 B2
(45) Date of Patent: Sep. 8, 2009

(54) SINGLE CHIP WITH MULTI-LED

(75) Inventors: Chih Peng Hsu, Yongkang (TW); Chester Kuo, Taipei (TW); Chih Pang Ma, Taoyuan County (TW)

(73) Assignee: Advanced Optoelectronic Technology Inc., Hsinchu County (TW)

( * ) Notice: Subject to any disclaimer, the term of this patent is extended or adjusted under 35 U.S.C. 154(b) by 187 days.

(21) Appl. No.: 11/606,937

(22) Filed: Dec. 1, 2006

(65) Prior Publication Data

US 2007/0131958 A1 Jun. 14, 2007

(30) Foreign Application Priority Data

Dec. 14, 2005 (TW) .............................. 94144214 A

(51) Int. Cl.
*H01L 29/207* (2006.01)
(52) U.S. Cl. .............................. 257/99; 257/96; 257/97; 257/88
(58) Field of Classification Search ...................... None
See application file for complete search history.

(56) References Cited

U.S. PATENT DOCUMENTS

| 4,775,645 | A | * | 10/1988 | Kurata et al. ................... 438/28 |
| 5,210,766 | A | * | 5/1993 | Winer et al. ................... 372/40 |
| 6,909,122 | B2 | | 6/2005 | Taninaka et al. |
| 7,417,259 | B2 | * | 8/2008 | Sakai et al. ..................... 257/88 |
| 2006/0151793 | A1 | * | 7/2006 | Nagai ............................ 257/79 |
| 2006/0231852 | A1 | * | 10/2006 | Kususe et al. ................. 257/99 |

* cited by examiner

*Primary Examiner*—Zandra Smith
*Assistant Examiner*—Paul E Patton
(74) *Attorney, Agent, or Firm*—Oliff & Berridge, PLC

(57) ABSTRACT

A single chip with multi-LED comprises a substrate on which an N-type semiconductor layer, an active layer and a P-type semiconductor layer are successively stacked. At least one N-type electrode is connected to the N-type semiconductor layer, and is exposed to an opening through the active layer and the P-type semiconductor layer. Further, at least one groove divides the P-type semiconductor layer into a plurality of separated regions, and a P-type electrode is disposed on each separated region.

14 Claims, 8 Drawing Sheets

SINGLE CHIP WITH MULTI-LED

BACKGROUND OF THE INVENTION

1. Field of the Invention

The present invention relates to a single chip with multi-LED, in which a plurality of LEDs is integrated, and the plurality of LEDs is connected by a metal wire to form a parallel circuit or a series circuit.

2. Description of the Related Art

An LED is a photoelectric device that actively emits light when electrically powered. Being small, electrically efficient and good for initial driving, LEDs are widely used in general illumination, large billboards, and backlight sources for monitors.

Currently, the important development trend in LEDs is to enhance luminant brightness, which can be achieved by increasing the size of LEDs. A LED provided by the photoelectric industry has an approximately rectangular area with the length of 12 mil to 14 mil. If the length is larger than 30 mil, the LED is called a high-brightness LED chip. The LED chip with a large area can provide a relatively large Ruminant area. However, many problems may be incurred. First, a relatively large luminance area cannot be formed across the entire large area. Current usually passes through a path with the lowest impedance, so in the large area, the light-emitting region with the current passing through is mainly concentrated in certain portions. Moreover, with the increase of the area of the LED, the paths for current passing through increase and the heat generated by the impedance increases greatly. The heat generated by the LED with a large area cannot be dissipated easily, so the working life of the LED is shortened, and the luminant efficiency is reduced.

Another method of achieving high brightness involves packaging a plurality of chips in one package body or one module, so as to replace the single LED chip with a large size. This method is used to mix the chips with different luminant colors to obtain white light or light with a specific color.

For the current LED industry, the multi-chip packaging method has many problems to be solved. First, the precision of the packaging table has a performance limitation, and the distance between the chips cannot be reduced to a minimum, so that it is difficult to reduce the package size. If the distance between the chips is too small, silver paste or solder used for fixing may be extruded, resulting in the LED short-circuiting. Further, the light beams emitted by the LED at different positions easily become scattered light beams after passing through a single lens.

Moreover, since the LED has the characteristics of a diode, i.e., the relation between the driving current and voltage of the diode does not conform to Ohm's Law, it is difficult to change the luminance brightness of the current LED by using the driving voltage. The changing of the brightness of the LED depends on the adjustment of the driving current of the LED, and the curve of the driving current and voltage of the LED is not completely linear. Therefore, in order to adjust the brightness of the LED, it is necessary to use the complex circuit to control current.

In view of the above, the market seeks to solve the problems of the high-brightness LED chip in terms of luminance area utilization rate, heat dissipation, service life, and difficulty in packaging.

SUMMARY OF THE INVENTION

An object of the present invention is to provide a signal chip with multi-LED, capable of solving the problem of current concentration in the chip, so as to overcome the problem of the utilization ratio of the luminance area.

Another object of the present invention is to integrate a plurality of LEDs into a parallel circuit in a signal chip, so as to share one N-type electrode, thereby simplifying the design or the connection of the circuit.

Still another object of the present invention is to provide a chip with multi-LED which can be easily packaged. Since the plurality of LEDs is integrated on one substrate through the same chip processes, a plurality of repeated steps can be omitted compared with the multi-chip packaging. The spacing of the LED units is defined by an etching step, such that the entire area occupied by the plurality of LEDs can be relatively reduced.

In order to achieve the above objects, the present invention provides a single chip with multi-LED comprising a substrate on which an N-type semiconductor layer, an active layer and a P-type semiconductor layer are successively stacked. At least one N-type electrode is connected to the N-type semiconductor layer, and is exposed to an opening through the active layer and the P-type semiconductor layer. Further, at least one groove divides the P-type semiconductor layer into a plurality of separated regions, and a P-type electrode is disposed on each separated region.

The number of the N-type electrodes is the same as that of the P-type electrodes, and one of the N-type electrode and one of the P-type electrode are successively connected together by at least one metal wire.

In an embodiment of the present invention, the number of each of the N-type electrodes and the P-type electrodes is two. The N-type electrodes and the P-type electrodes are successively connected in series by two metal wires to form a loop.

BRIEF DESCRIPTION OF THE DRAWINGS

The invention will be described according to the appended drawings in which.

PREFERRED EMBODIMENT OF THE PRESENT INVENTION

Figure 1:
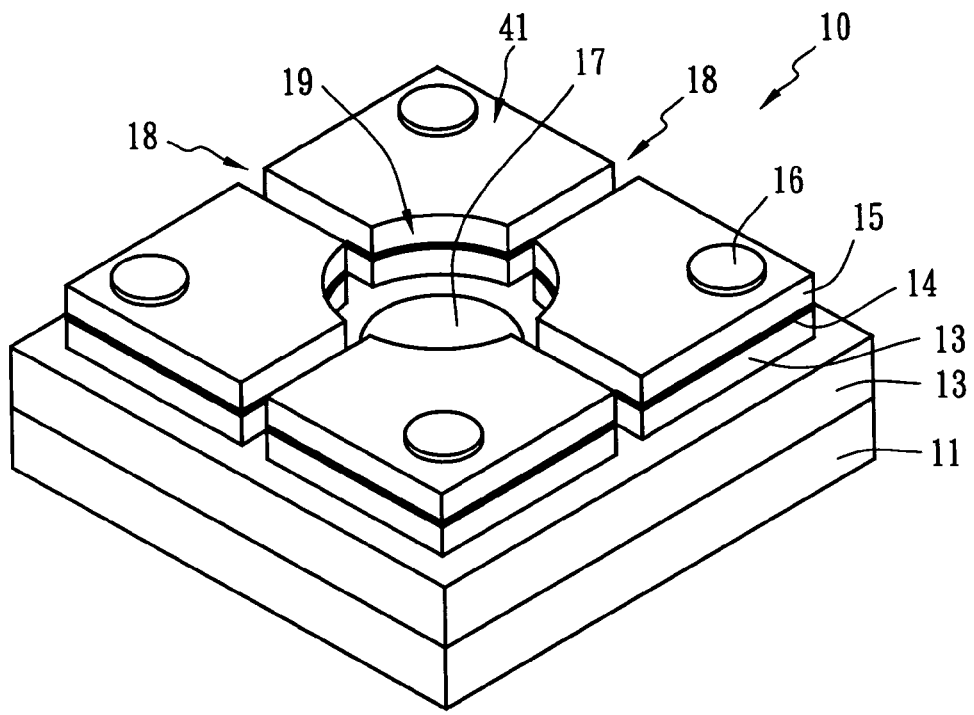
FIG. 1 is a schematic perspective view of the single chip with multi-LED of the present invention.
Figure 2:
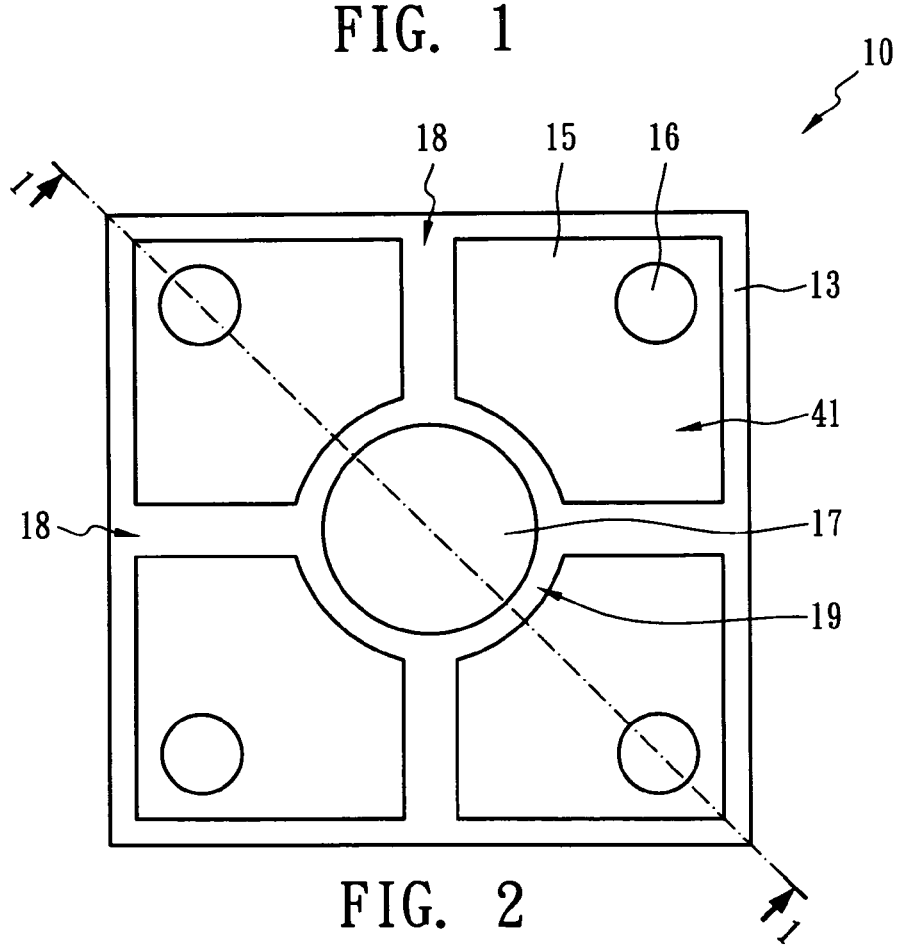
FIG. 2 is a top view of the LED chip in FIG. 1.

FIG. 1 is a schematic perspective view of the single chip with multi-LED of the present invention. The LED chip 10 includes an N-type semiconductor layer 13, an active layer 14 and a P-type semiconductor layer 15 successively formed on a substrate 11. Then, an N-type electrode 17 and a P-type electrode 16 are formed through steps such as etching and depositing. Referring to FIG. 2, the LED chip 10 includes grooves 18 that divide the P-type semiconductor layer 13 into four LED units 41 connected in parallel. The P-type electrodes 16 of the LED units 41 are located at the four corners respectively, and the N-type electrode 17 is disposed in an opening 19 in the center and is shared by the four LED units 41.

Figure 3:
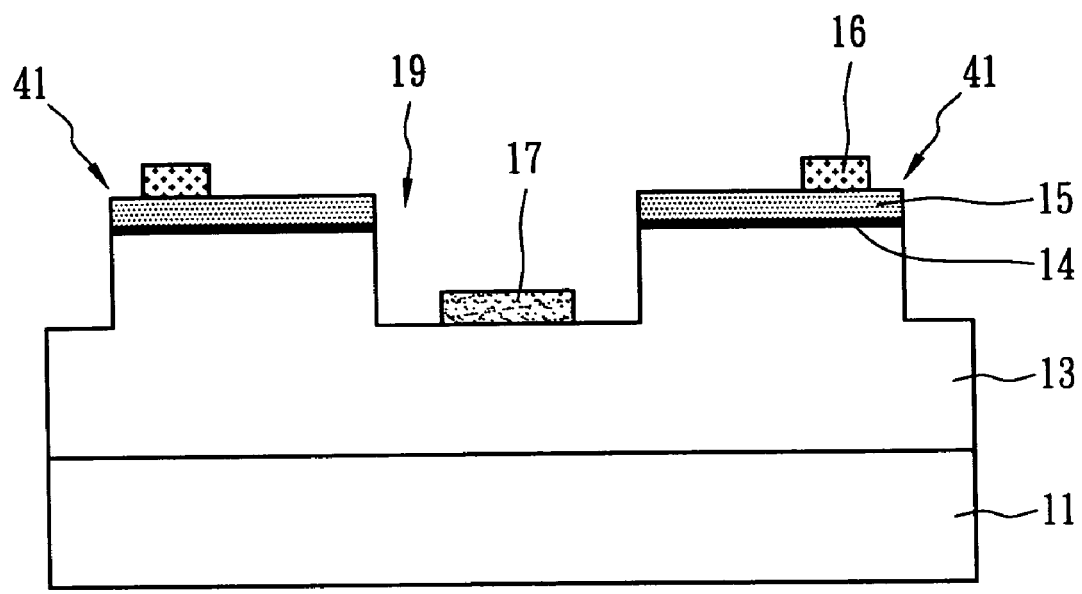
FIG. 3 is a cross-sectional view along the section line 1-1 of FIG. 2.

FIG. 3 is a cross-sectional view along the section line 1-1 in FIG. 2. The N-type electrode 17 is directly stacked on the N-type semiconductor layer 13. Electrons usually move towards the P-type electrodes 16 from the position below the N-type electrode 17, and the electron holes move towards the N-type electrode 17 from the P-type electrodes 16 at the same time. When the electrons and the electron holes are bound in the active layer 14, the energy is released to emit light rays. The electrons and the holes mainly move along the path with the lowest resistance between one of the P-type electrodes 16 and the N-type electrode 17. Since the binding of the electrons and the holes occurs in the areas of the active layer 14 near the P-type electrodes 16, the N-type electrode 17 disposed in the center can effectively improve the utilization rate of the light-emitting area, so as to quickly conduct the heat resulting from the binding to the outside via the side surfaces, and to effectively prevent the heat from being accumulated in the center, thereby facilitating heat dissipation.

Moreover, the area of one of the four P-type electrodes 16 can be increased. In electrical testing, the enlarged P-type electrodes 16 and the N-type electrode 17 can be contacted with two probes respectively. One group of probes is selected to apply a testing current, and the other group of probes detects the electrical signal, so as to prevent the temperature from rising during testing, and avoiding errors.

Figure 4:
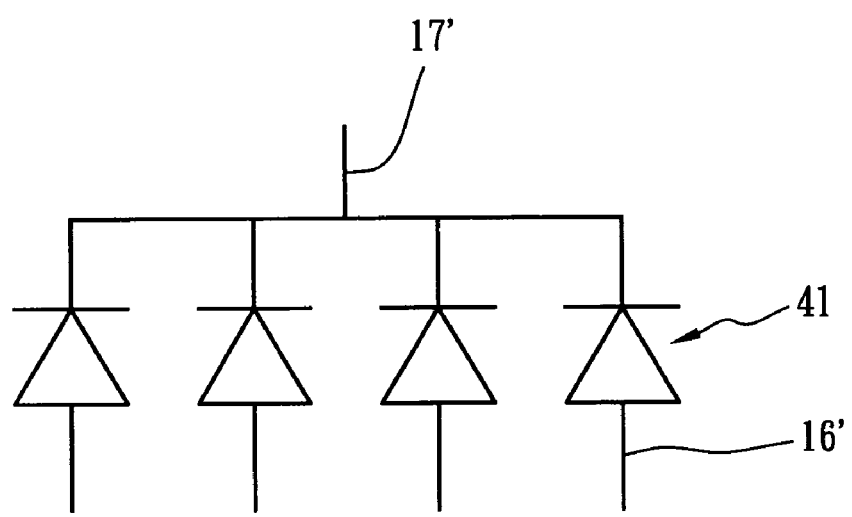
FIG. 4 is a diagram showing the equivalent circuit of the chip in FIG. 1.

FIG. 4 is a diagram showing the equivalent circuit of the chip in FIG. 1. The N electrode terminals of the four LED units 41 are connected to a common terminal 17' together, and the P electrode terminals 16' can also be connected to a single lead or different leads in the subsequent packaging process. When the P electrode terminals 16' are connected to different leads, the four LED units 41 can be pulse-driven in time-domain.

Figure 5:
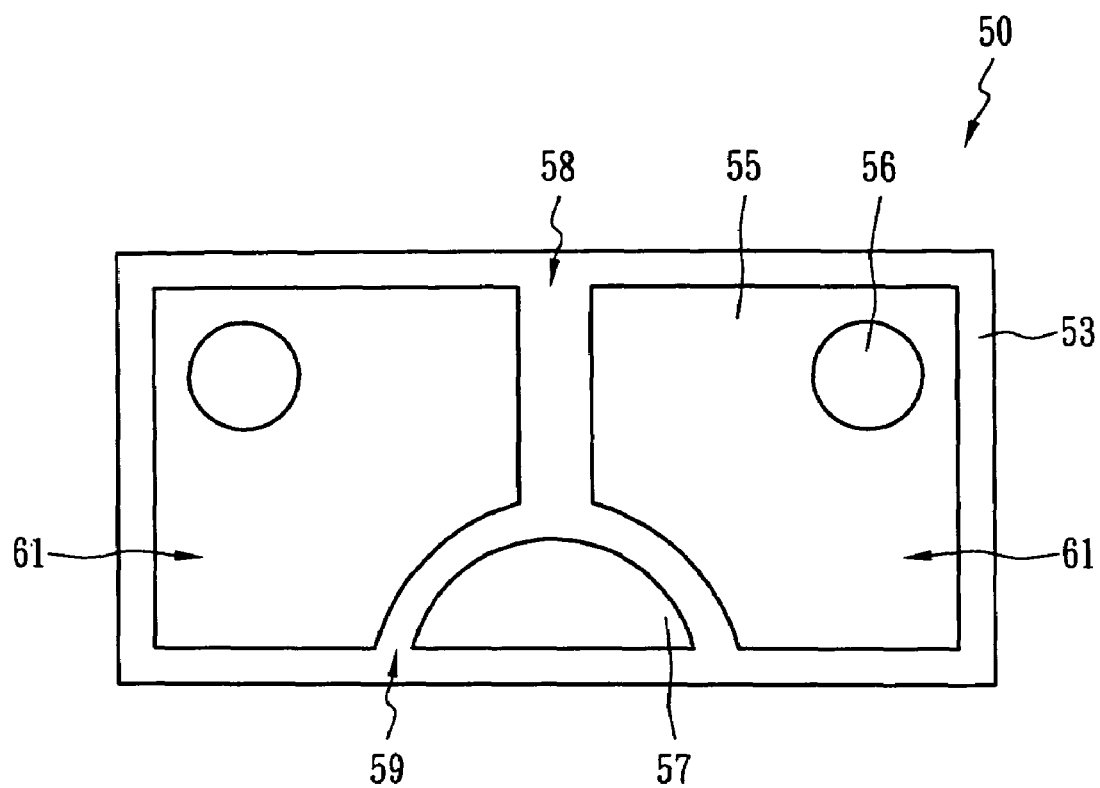
FIG. 5 is a top view of the LED chip in accordance with the second embodiment of the present invention.
Figure 6:
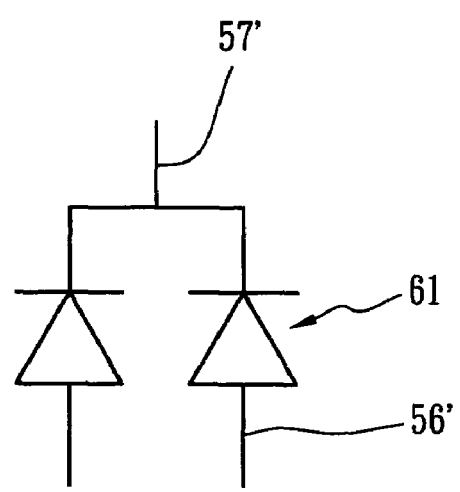
FIG. 6 is a diagram showing the equivalent circuit of the LED chip in FIG. 5.

Moreover, the LED chip 10 is modified into a structure of two LED units 61 connected in parallel, as shown in FIG. 5. It is obvious that the LED chip 50 is one half of the LED chip 10. The semicircular N-type electrode 57 is disposed in an opening 59, and is directly stacked on the N-type semiconductor layer 13. The P-type electrodes 56 on the two sides are symmetrical about the groove 58, and the P-type semiconductor layer 55 is disposed under the P-type electrodes 56. FIG. 6 shows the equivalent circuit of the two LED units 61 on the left and right sides. The N electrode ends of the LED 61 are connected to a common end 57' together, and the P electrode ends 56' are separated from each other.

Figure 7:
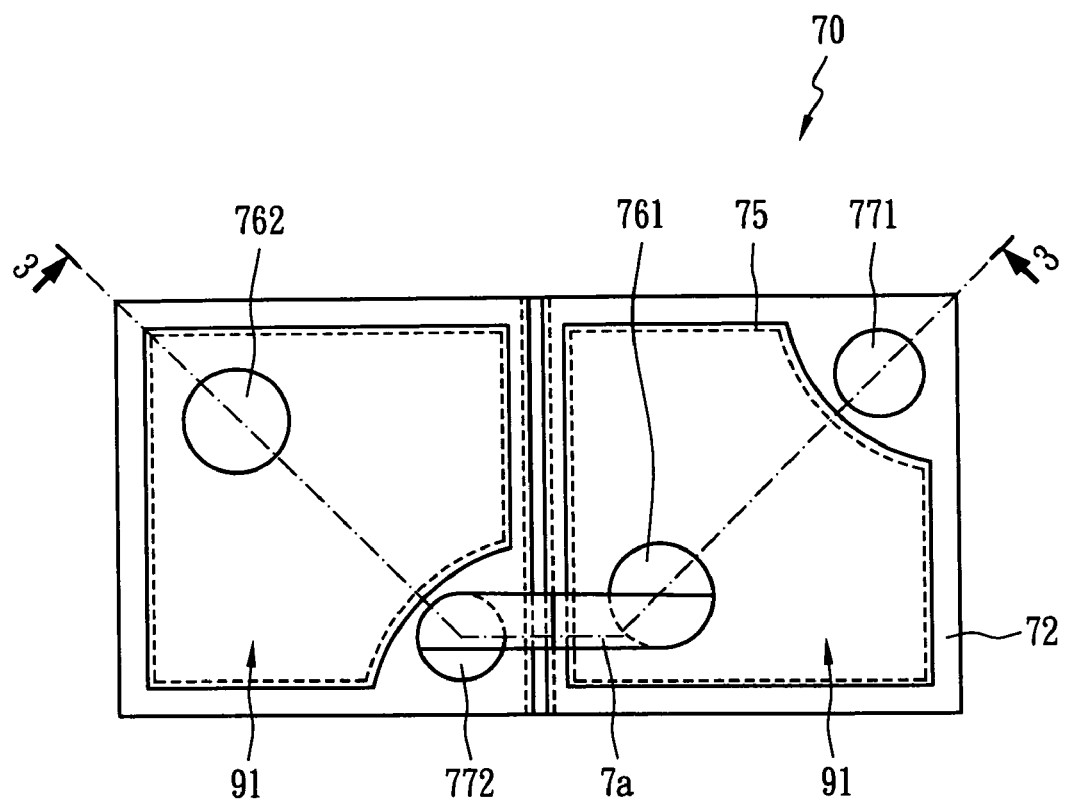
FIG. 7 is a top view of the LED chip in accordance with the third embodiment of the present invention.

In addition to the two LED units connected in parallel described above, the LED units can be connected in series, as shown in FIG. 7. The LED chip 70 has two LED units 91. The LED unit 91 on the right side has a set of a P-type electrode 761 and an N-type electrode 771, and the LED unit 91 on the left side has a set of a P-type electrode 762 and an N-type electrode 772. The N-type electrode 772 and the P-type electrode 761 can be connected in series by the metal wire 7a. The surface of the chip 70 except for the metal wire 7a, the P-type electrodes 761, 762 and the N-type electrode 771, 772 is covered by an insulation layer 72.

Figure 8:
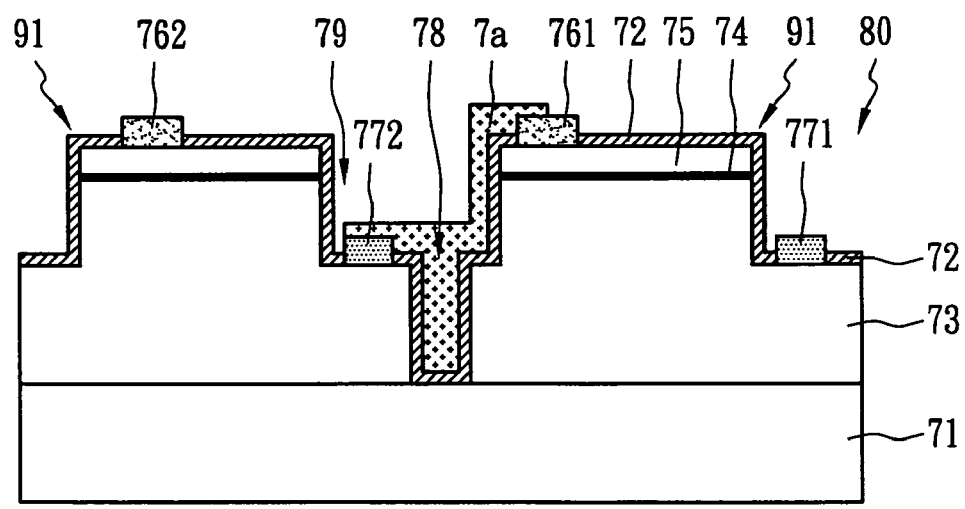
FIG. 8 is a cross-sectional view along the section line 3-3 of FIG. 7.

FIG. 8 is a cross-sectional view along the section line 3-3 in FIG. 7. Similarly, an N-type semiconductor layer 73, an active layer 74 and a P-type semiconductor layer 75 are successively formed on a substrate 71. A groove 78 is located in the middle of the chip 70 to separate the two LED units 91, and an insulation layer 72 and a metal wire 7a are successively deposited in the groove 78. Also, the N-type electrode 772 is disposed in an opening 79, and another N-type electrode 771 is disposed in another opening 79.

Figure 9:
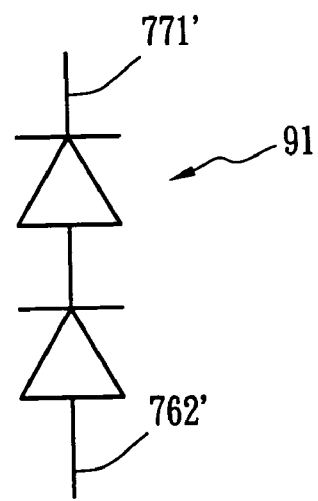
FIG. 9 is a diagram showing the equivalent circuit of the LED chip in FIG. 7.

FIG. 9 is diagram showing an equivalent circuit of the LED chip 70. The two LED units 91 are connected in series. The P electrode end 762' and the N electrode end 771' respectively correspond to the N-type electrode 771 and the P-type electrode 762 in FIG. 8. The LED units 91 connected in series have convenience in application. For example, the voltage in the vehicle is 20 Volt (V), the operating voltage of four LED units 91 connected in series can be designed to be 14 V (3.5*4=14), and then a small resistor capable of providing 6 V voltage drop is connected in series. Otherwise, if a single LED unit 91 usually having the operating voltage of 3.5 V is operated, a big resistor is required to provide the 16.5 V voltage drop from 20 V, which results in a large amount of heat energy.

Figure 10:
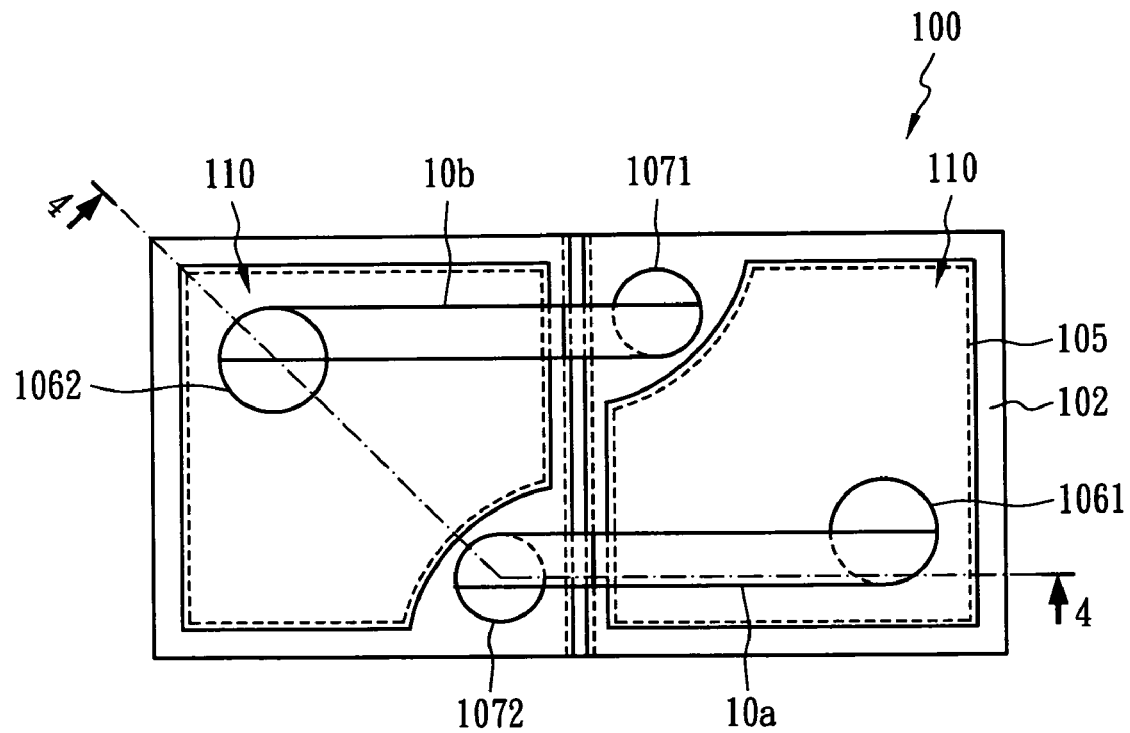
FIG. 10 is a top view of the LED chip in accordance with the fourth embodiment of the present invention.

In addition to the embodiment of connecting the LED units in parallel and in series, the two LED units can be designed to be connected in antiparallel (see FIG. 16), as shown in FIG. 10. The N-type electrode 1071 and the P-type electrode 1062 of the LED chip 100 are connected by the metal wire 10b, and the N-type electrode 1072 and the P-type electrode 1061 are connected by the metal wire 10a. The surface of the chip 100 except for the metal wires 10a and 10b, the P-type electrodes 1061 and 1062 and the N-type electrodes 1071 and 1072 is covered by an insulation layer 102.

Figure 11:
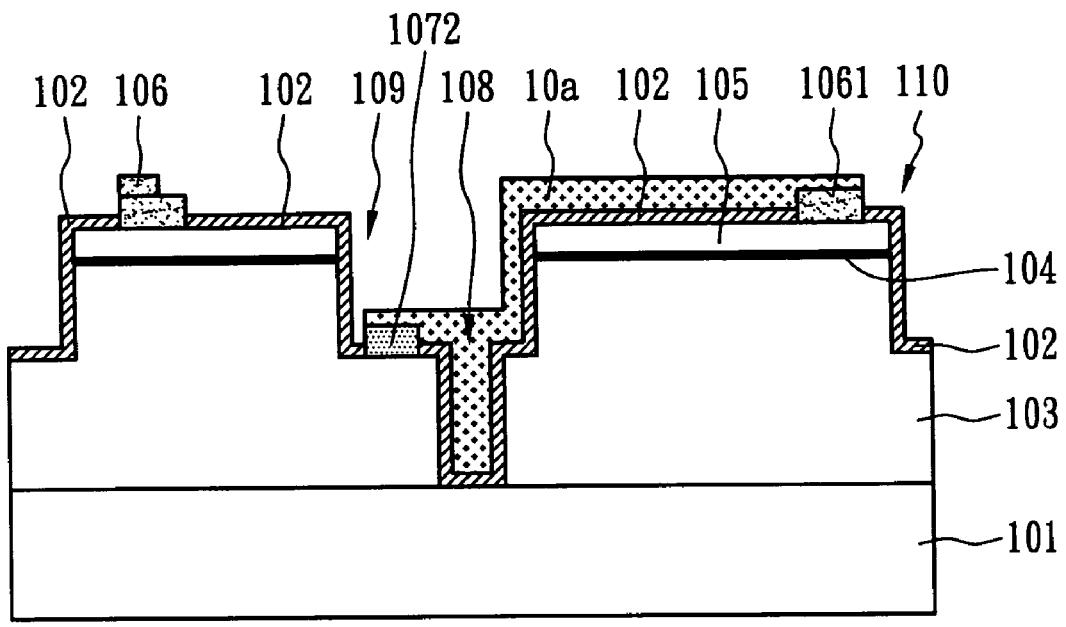
FIG. 11 is a cross-sectional view along the section line 4-4 in FIG. 10.

FIG. 11 is a cross-sectional view along the section line 4-4 in FIG. 10. Similarly, an N-type semiconductor layer 103, an active layer 104 and a P-type semiconductor layer 105 are successively formed on a substrate 101. A groove 108 is located in the middle of the chip 100 to separate the two LED units 110, and an insulation layer 102 and a metal wire 10a are successively deposited in the groove 108. Similarly, the N-type electrode 1072 is disposed in an opening 109, and another N-type electrode 1072 is disposed at an opening 110.

Figure 12:
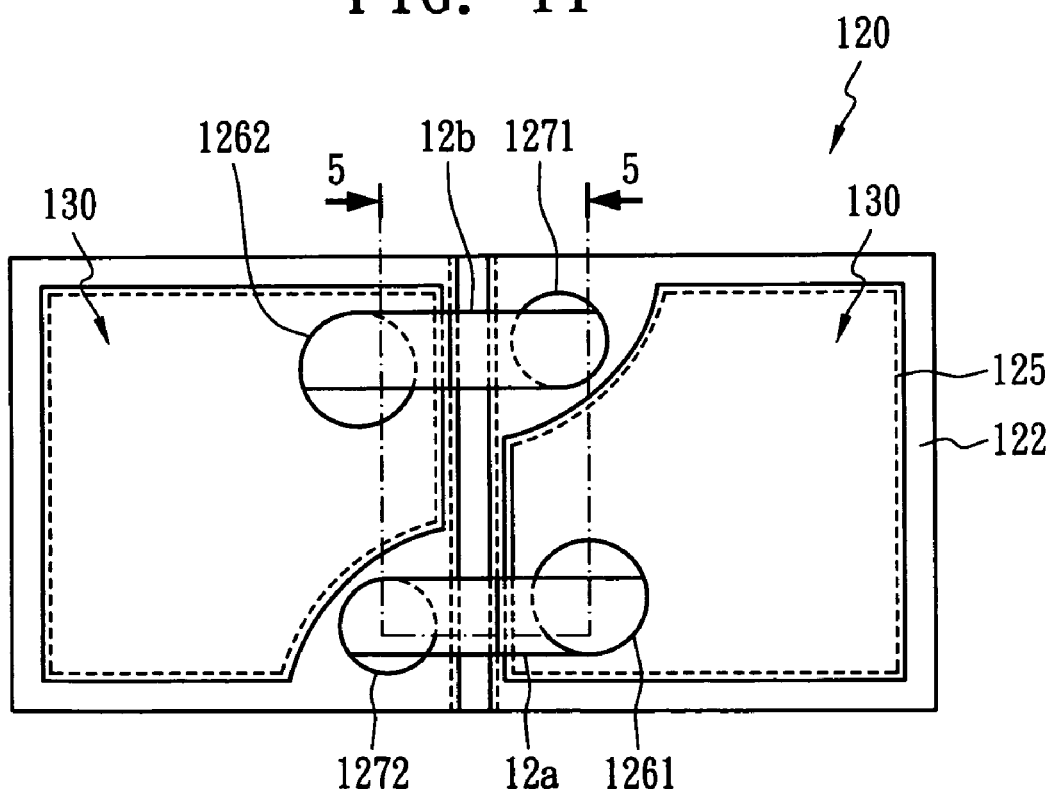
FIG. 12 is a top view of the LED chip in accordance with the fifth embodiment of the present invention.

In order to reduce the length of the metal wire, the N-type electrode 1271 and the P-type electrode 1262 of the LED chip 120 are connected by the metal wire 12b, and the N-type electrode 1272 and the P-type electrode 1261 are connected by the metal wire 12a, as shown in FIG. 12. The surface of the chip 120 except for the metal wires 12a, 12b, the P-type electrodes 1261, 1262 and the N-type electrodes 1271, 1272 is covered by an insulation layer 122.

Figure 13:
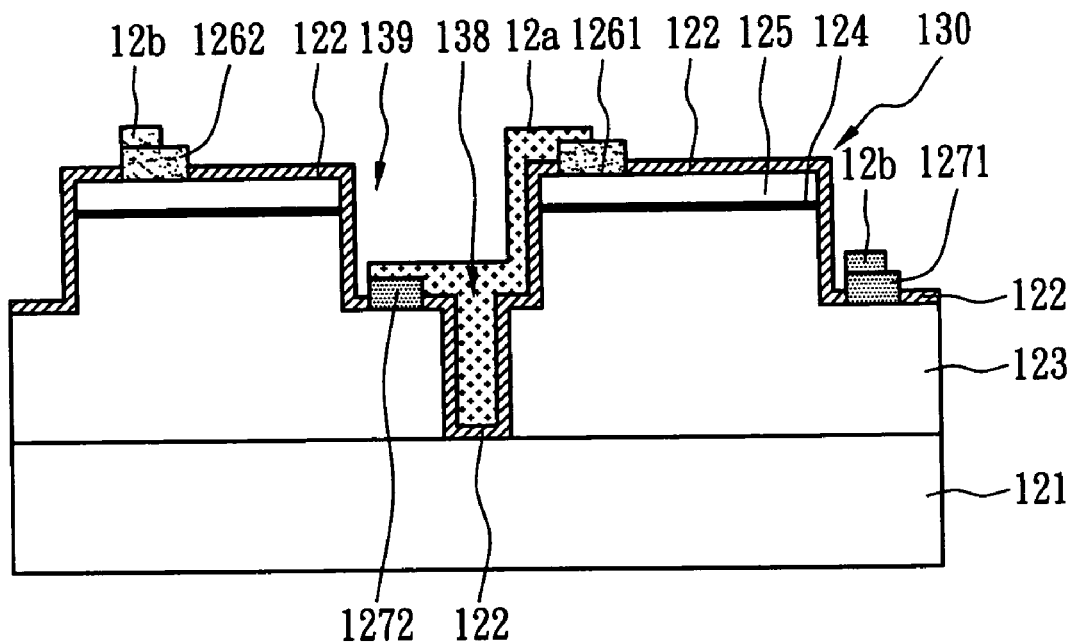
FIG. 13 is a cross-sectional view along the section line 5-5 of FIG. 12.

FIG. 13 is a cross-sectional view along the section line 5-5 in FIG. 12. Similarly, an N-type semiconductor layer 123, an active layer 124 and a P-type semiconductor layer 125 are successively formed on a substrate 121. A groove 138 is located in the center of the chip 120 to separate the two LED units 130, and an insulation layer 122 and a metal wire 12a are successively deposited in the groove 138. Also, the N-type electrode 1272 is disposed in an opening 139, and another N-type electrode 1071 is disposed at an opening 130.

Figure 14:
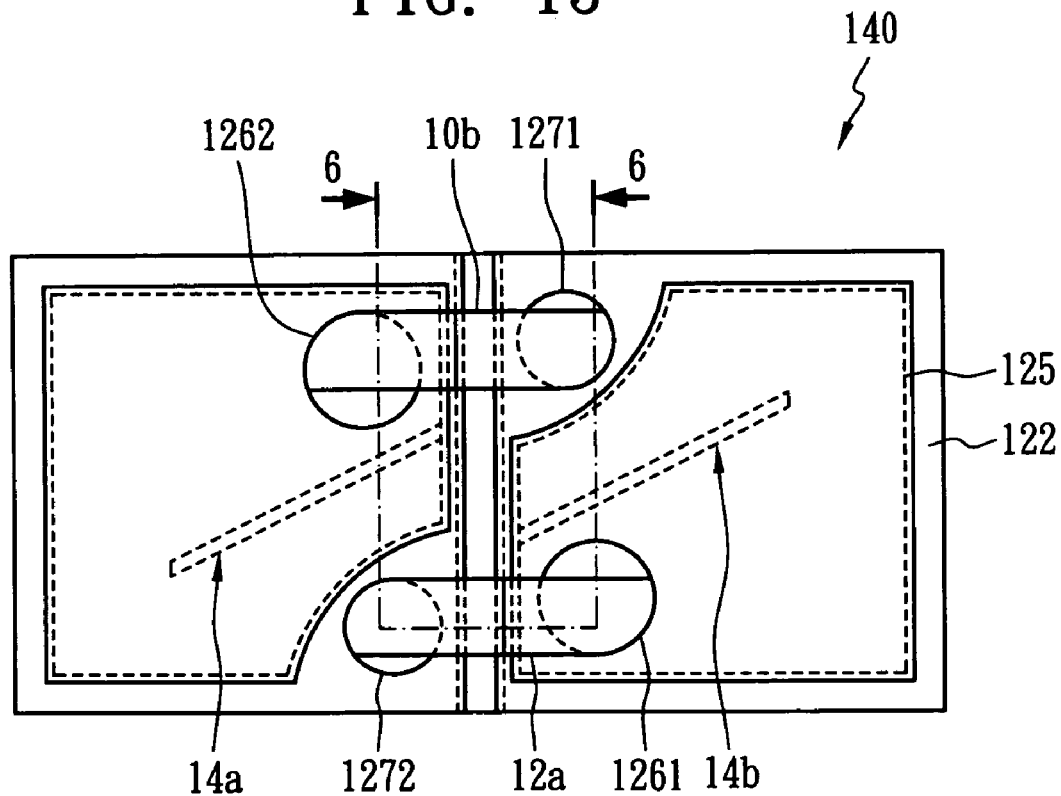
FIG. 14 is a top view of the LED chip in accordance with the sixth embodiment of the present invention.
Figure 15:
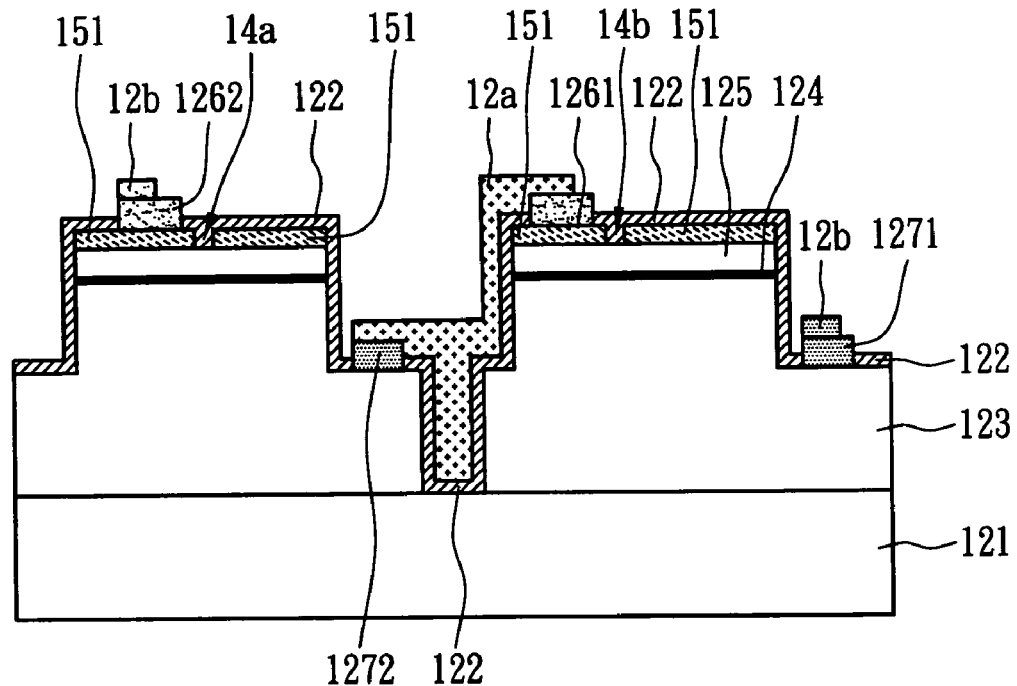
FIG. 15 is a cross-sectional view along the section line 6-6 of FIG. 14.

If the distance between the N-type electrode 1271 and the P-type electrode 1261 of the LED chip 120 is too short, the current may pass through the path with the lowest impedance between the two electrodes, and thus most of the area cannot be used to emit light. Therefore, in FIG. 14, another embodiment is provided to solve the above problem. A transparent conductive layer (TCL) 151 is added between the insulation layer 122 and the P-type semiconductor layer 125 (see FIG. 15, the cross-sectional view along the section line 6-6 in FIG. 14), and the slots 14*a* and 14*b* are formed on the TCL 151. The slot 14*a* separates the N-type electrode 1272 and the P-type electrode 1262, and the slot 14*b* separates the N-type electrode 1271 and the P-type electrode 1261, so the current path passes by the slot 14*a* and the slot 14*b*, thus increasing the relative effective luminance area.

Figure 16:
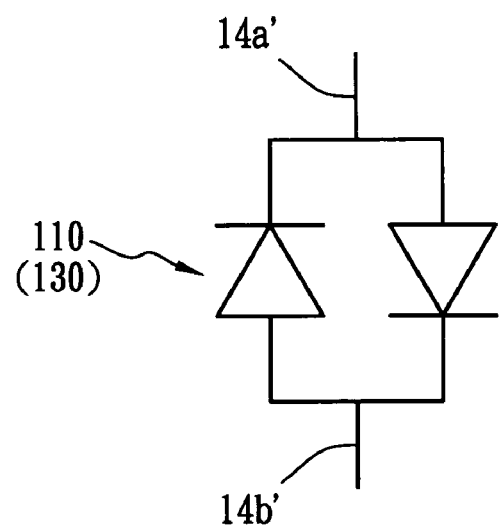
FIG. 16 is a diagram showing the equivalent circuit of the LED chip in FIGS. 10, 12 and 14.

The equivalent circuit of the LED chips 100, 120 and 140 is the antiparallel mode of the LED unit 110, as shown in FIG. 16. In the design of the antiparallel circuit, the area of the N-type electrode can be reduced since the N-type electrode is not used as the pad for the subsequent packaging. When the two electrode ends 14*a*' and 14*b*' are connected in series to an alternating current (AC) power supply, the antiparallel equivalent circuit can replace the rectifier in the original driving circuit. The AC can be directly used for driving, so for indoor or fixed applications, the loop of the design can be simplified, and different regions on the chip can be used to achieve interlaced light emission, thereby preventing the heat accumulation in the continuous operation and prolonging the service life.

The aforementioned descriptions of the present invention are intended to be illustrative only. Numerous alternative methods may be devised by persons skilled in the art without departing from the scope of the following claims.

What is claimed is:

1. A single chip with multi-LED, comprising:
   a substrate;
   an N-type semiconductor layer disposed on the substrate;
   an active layer disposed on a part of the N-type semiconductor layer;
   a P-type semiconductor layer disposed on the active layer;
   a plurality of grooves dividing the P-type semiconductor layer and the active layer into a plurality of separated regions;
   a plurality of P-type electrodes respectively disposed in the separated regions of the P-type semiconductor layer; and
   an N-type electrode disposed on the N-type semiconductor layer;
   wherein the P-type electrodes and the N-type electrode are on a same side of the N-type semiconductor layer and the P-type electrodes are connected to the N-type electrode in parallel.

2. The single chip with multi-LED of claim 1, wherein the N-type semiconductor layer is exposed in the grooves, and the N-type electrode is located on the N-type semiconductor layer in the grooves.

3. The single chip with multi-LED of claim 1, wherein the P-type semiconductor layer and the active layer are divided into four separated regions, and the N-type electrode is located in the center of the four regions.

4. The single chip with multi-LED of claim 3, wherein the area of one of the N-type electrode and the P-type electrodes is suitable to accommodate two probes to contact simultaneously.

5. The single chip with multi-LED of claim 1, wherein the P-type semiconductor layer and the active layer are divided into two separated regions, and the N-type electrode is located between the two regions.

6. The single chip with multi-LED of claim 1, wherein the P-type electrodes and the N-type electrode are disposed in a manner that the distance between the N-type electrode and each of the P-type electrodes is maximum and the P-type electrodes have a equal distance between each other.

7. The single chip with multi-LED of claim 1, further comprising a transparent conductive layer (TCL) disposed on the separated P-type semiconductor layer respectively, wherein the TCL has at least one slot between the N-type electrode and the P-type electrodes.

8. The single chip with multi-LED of claim 1, wherein the grooves divides the N-type semiconductor layer into a plurality of separated regions.

9. A single chip with multi-LED, comprising:
   a substrate;
   an N-type semiconductor layer disposed on the substrate;
   an active layer disposed on a part of the N-type semiconductor layer;
   a P-type semiconductor layer disposed on the active layer;
   at least one groove dividing the P-type semiconductor layer and the active layer into a plurality of separated regions and not dividing the N-type semiconductor layer into a plurality of separated regions;
   a plurality of P-type electrodes respectively disposed in the separated regions of the P-type semiconductor layer; and
   an N-type electrode disposed on the N-type semiconductor layer and not overlapping the P-type electrodes.

10. The single chip with multi-LED of claim 9 wherein the N-type semiconductor layer is exposed in the groove, and the N-type electrode is located on the N-type semiconductor layer in the groove.

11. The single chip with multi-LED of claim 9 wherein the P-type semiconductor layer and the active layer are divided into four separated regions, and the N-type electrode is located in the center of the four regions.

12. The single chip with multi-LED of claim 11, wherein the area of one of the N-type electrode and the P-type electrode is suitable to accommodate contacting with two probes simultaneously.

13. The single chip with multi-LED of claim 9, wherein the P-type semiconductor layer and the active layer are divided into two separated regions, and the N-type electrode is located between the two regions.

14. A single chip with multi-LED, comprising:
   a substrate;
   an N-type semiconductor layer disposed on the substrate;
   an active layer disposed on a part of the N-type semiconductor layer;
   a P-type semiconductor layer disposed on the active layer;
   at least one groove dividing the P-type semiconductor layer and the active layer into a plurality of separated regions;
   a plurality of P-type electrodes respectively disposed in the separated regions of the P-type semiconductor layer; and
   at least one N-type electrode disposed on the N-type semiconductor layer;
   wherein the at least one N-type electrode and the P-type electrodes are connected in parallel, or antiparallel.

* * * * *